United States Patent
Bosholm et al.

(10) Patent No.: US 7,785,935 B2
(45) Date of Patent: Aug. 31, 2010

(54) MANUFACTURING METHOD FOR FORMING AN INTEGRATED CIRCUIT DEVICE AND CORRESPONDING INTEGRATED CIRCUIT DEVICE

(75) Inventors: Ole Bosholm, Dresden (DE); Marco Lepper, Dresden (DE); Goetz Springer, Dresden (DE); Detlef Weber, Ottendorf-Okrilla (DE); Grit Bonsdorf, Dresden (DE); Frank Pietzschmann, Dresden (DE)

(73) Assignee: Qimonda AG, Munich (DE)

( * ) Notice: Subject to any disclaimer, the term of this patent is extended or adjusted under 35 U.S.C. 154(b) by 218 days.

(21) Appl. No.: 11/983,899

(22) Filed: Nov. 13, 2007

(65) Prior Publication Data

US 2009/0121314 A1 May 14, 2009

(51) Int. Cl.
*H01L 21/82* (2006.01)
*H01L 21/311* (2006.01)

(52) U.S. Cl. .................. 438/132; 438/694; 438/761; 257/529; 257/E23.149; 257/E21.592

(58) Field of Classification Search ................. 438/132, 438/467, 601, 694, 761; 257/529, E23.149, 257/E21.592; *H01L 21/311; H01L 23/525*
See application file for complete search history.

(56) References Cited

U.S. PATENT DOCUMENTS

| 6,440,833 | B1 * | 8/2002 | Lee et al. .................... 438/601 |
| 2007/0166992 | A1 * | 7/2007 | Daubenspeck et al. ...... 438/613 |
| 2007/0254470 | A1 | 11/2007 | Jung | |

* cited by examiner

*Primary Examiner*—Luan C Thai
(74) *Attorney, Agent, or Firm*—Fay Kaplun & Marcin, LLP

(57) ABSTRACT

The present invention provides a manufacturing method for forming an integrated circuit device and to a corresponding integrated circuit device. The manufacturing method for forming an integrated circuit device comprises the steps of: forming a first level on a substrate; forming a second level above the first level; forming a cap layer on the second level which covers a first region of the level and leaves a second region uncovered; and simultaneously etching a first contact hole in the first region and a second contact hole in the second region such that the etching is selective to the cap layer in the second region and proceeds to a greater depth in the first region.

12 Claims, 10 Drawing Sheets

MANUFACTURING METHOD FOR FORMING AN INTEGRATED CIRCUIT DEVICE AND CORRESPONDING INTEGRATED CIRCUIT DEVICE

BACKGROUND OF THE INVENTION

The present invention relates to a manufacturing method for forming an integrated circuit device and to a corresponding integrated circuit device. Although in principle applicable to arbitrary integrated circuit devices, the following invention and the underlying problems will be explained with respect to integrated memory circuits in silicon technology.

Memory circuits of today usually comprise fuses in order provide redundancy elements. Said fuses are e.g. used in order to activate said redundancy elements, e.g. by irradiation of laser energy. Said fuses may be located in a process level which is below a contact pad metal level. Both for the fuse level and the contact pad metal level, contact holes are formed during the fabrication process.

It has been attempted to open the contact holes for the fuse window and the pad simultaneously. If the fuses are located in a metal level one layer below the pad metal level, such a simultaneous etching step would use the metal pad as an etch stop.

For pads made of copper-containing materials or copper, a simultaneous etching step may lead to corrosion of the exposed copper comprising pad. Additionally, copper damascene layers usually have a cap layer (top barrier) in order to prevent copper diffusion and achieve the electro-migration and stress migration performance needed for reliability purposes. E.g. silicon nitride or silicon carbide films are used as cap layer material. It would be desirable that the etching steps of opening the fuse-window and the contact pads could be made simultaneously without having the problem of pad corrosion.

BRIEF SUMMARY OF THE INVENTION

Various aspects of the invention are listed in independent claims 1, 14, and 20, respectively.

Further aspects are listed in the respective dependent claims.

In the Figures, identical reference signs denote equivalent or functionally equivalent components.

DETAILED DESCRIPTION

FIGS. 1A-E show schematic layouts for illustrating a manufacturing method for an integrated circuit device according to a first embodiment of the present invention.

Figure 1A:
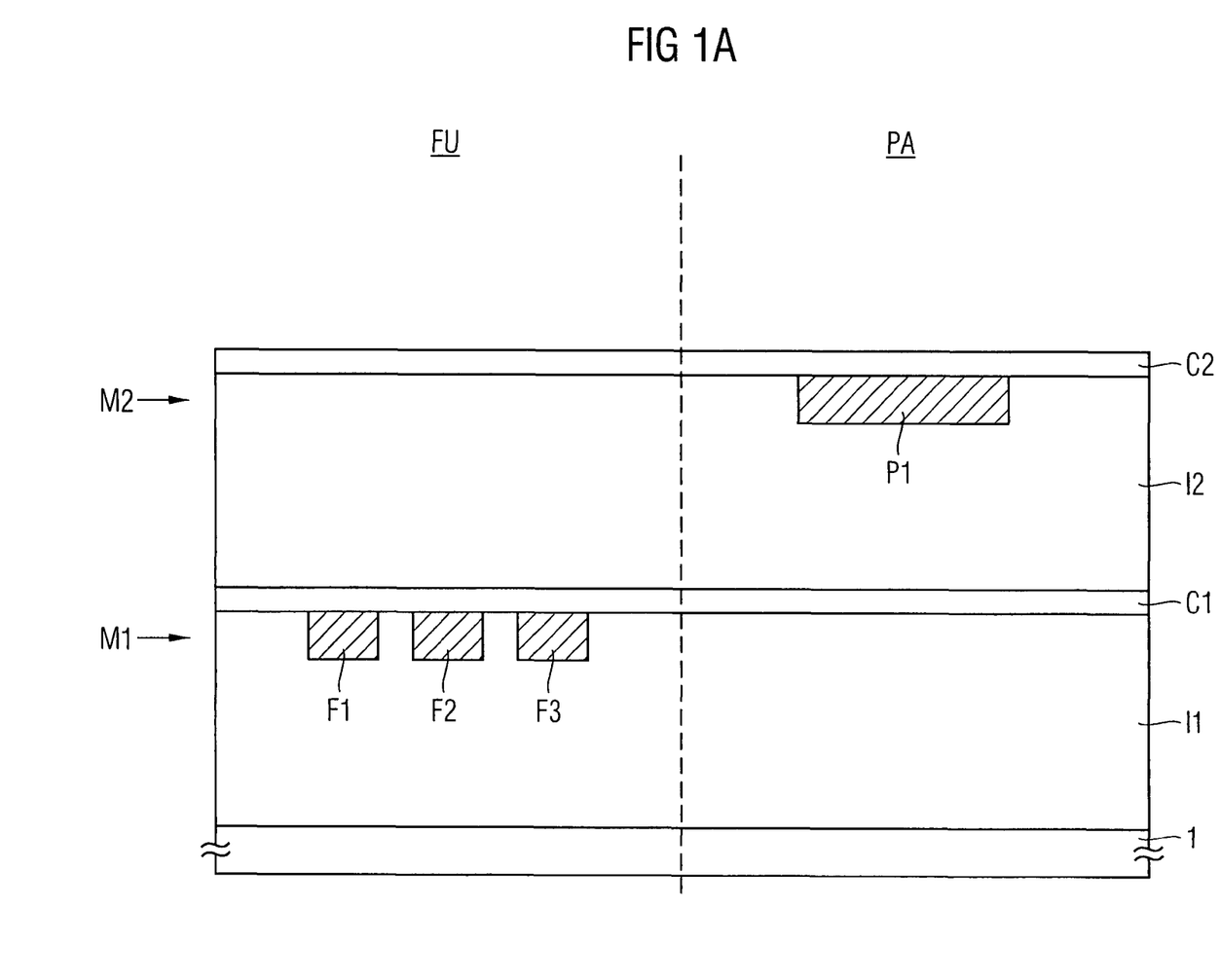
FIGS. 1A-F show schematic layouts for illustrating a manufacturing method for an integrated circuit device according to a first embodiment of the present invention.

In FIG. 1A reference sign 1 denotes an integrated circuit substrate, e.g. a wafer including a (not shown) integrated circuit. In a first metal level M1, fuses F1, F2, F3 made of copper or a copper comprising material (e.g. AlCu), especially a copper rich material, are embedded in a first insulating layer I1, e.g. a silicon oxide layer. The first metal level M1 may be formed by a damascene process. A copper damascene process is well known in the art and does need to be explained here in detail.

Said fuses F1, F2, F3 are formed in a fuse region FU of said integrated circuit device. Above said first metal level M1 an optional first cap layer C1 made of silicon carbide or silicon nitride is deposited.

Above said first protective layer C1, a second metal level M2 is formed in copper damascene technique. This second metal level M2 comprises a contact pad P1 in a pad area PA made of a copper-containing material or a copper comprising material, especially a copper rich material, embedded in a second insulating layer I2, e.g. another silicon oxide layer. The pad is connected to (not shown) wiring lines in the metal level M1 and/or other levels.

Other metal levels may also be formed between the levels M1, M2.

After fabrication of the second metal level M2, a second cap layer C2, which may comprise silicon carbide or silicon nitride, is deposited on the second metal level M2. This leads to the process status shown in FIG. 1B.

Figure 1B:
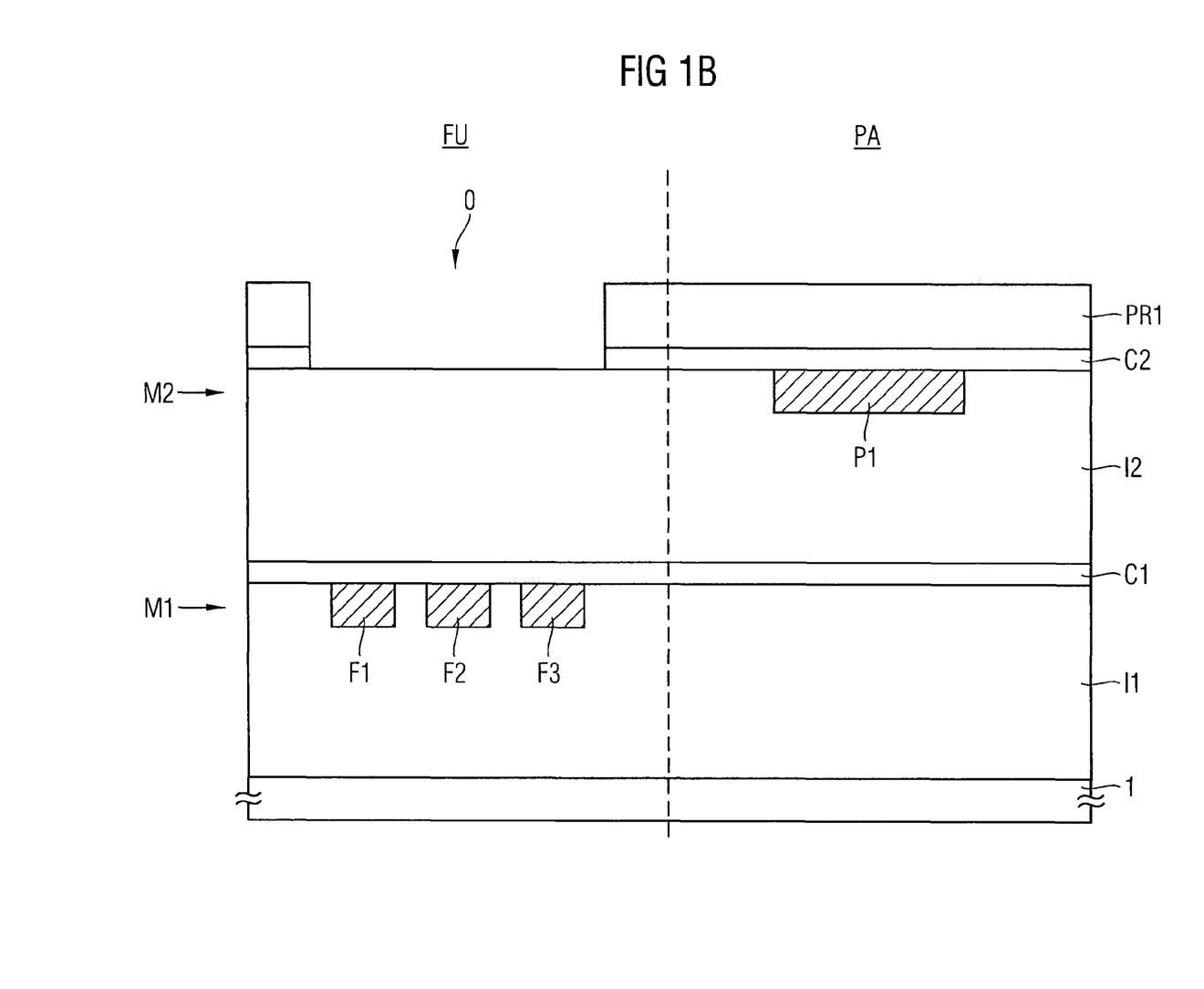
Figure 1C:
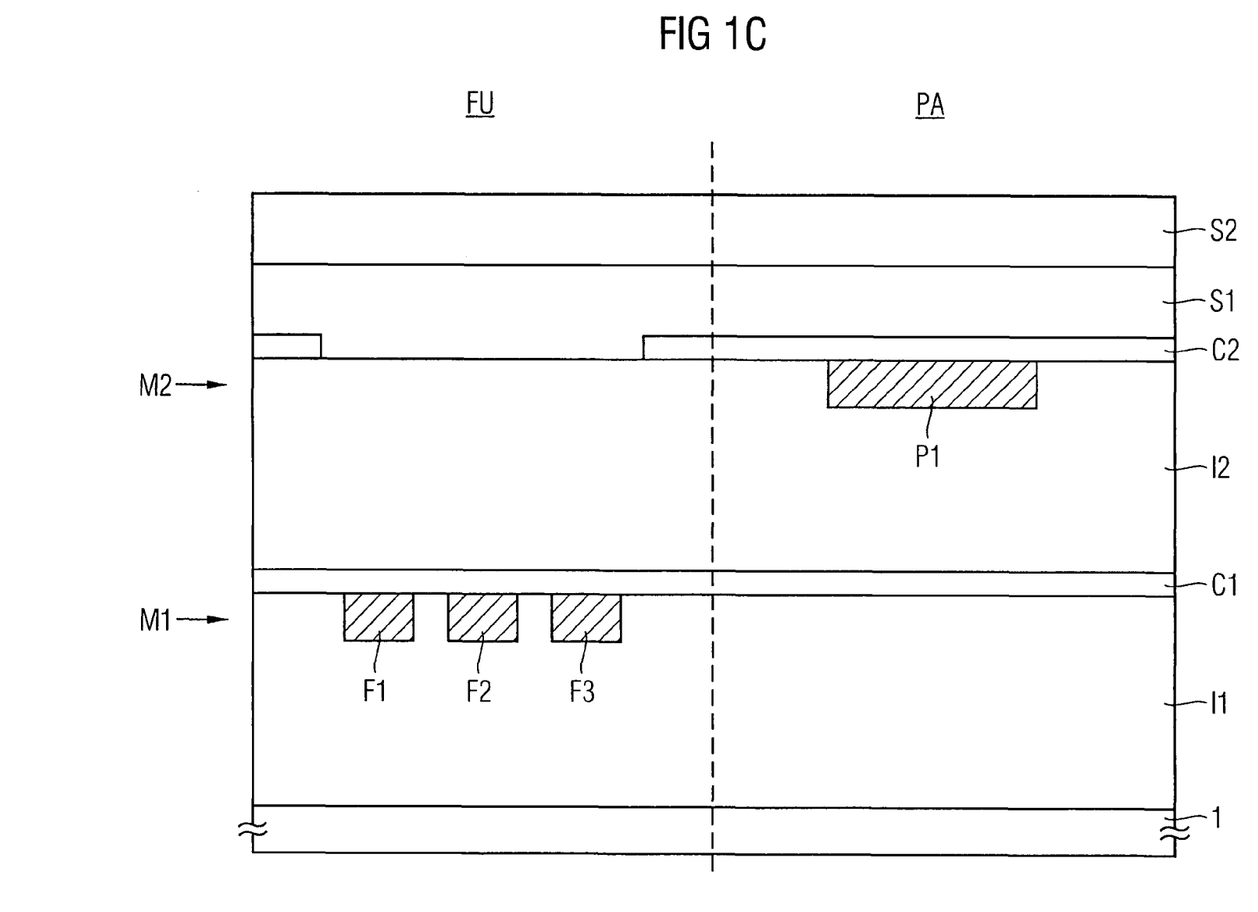

Having regard to FIG. 1B, a first photo-resist mask is formed on the second cap layer C2 such that it includes a window O in said fuse region FU. This window O is arranged such that the second cap layer C2 can be removed from above the fuses F1, F2, F3 in said fuse region FU.

After a corresponding etching step for removing the exposed part of the second cap layer C2 in said window O, the first photo-resist mask PR1 is removed and a first protective layer S1, which may comprise silicon oxide, and second protective layer S2, which may comprise silicon nitride, are deposited above the fuse region FU and the pad region PA. This leads to the process state shown in FIG. 1C.

Figure 1D:
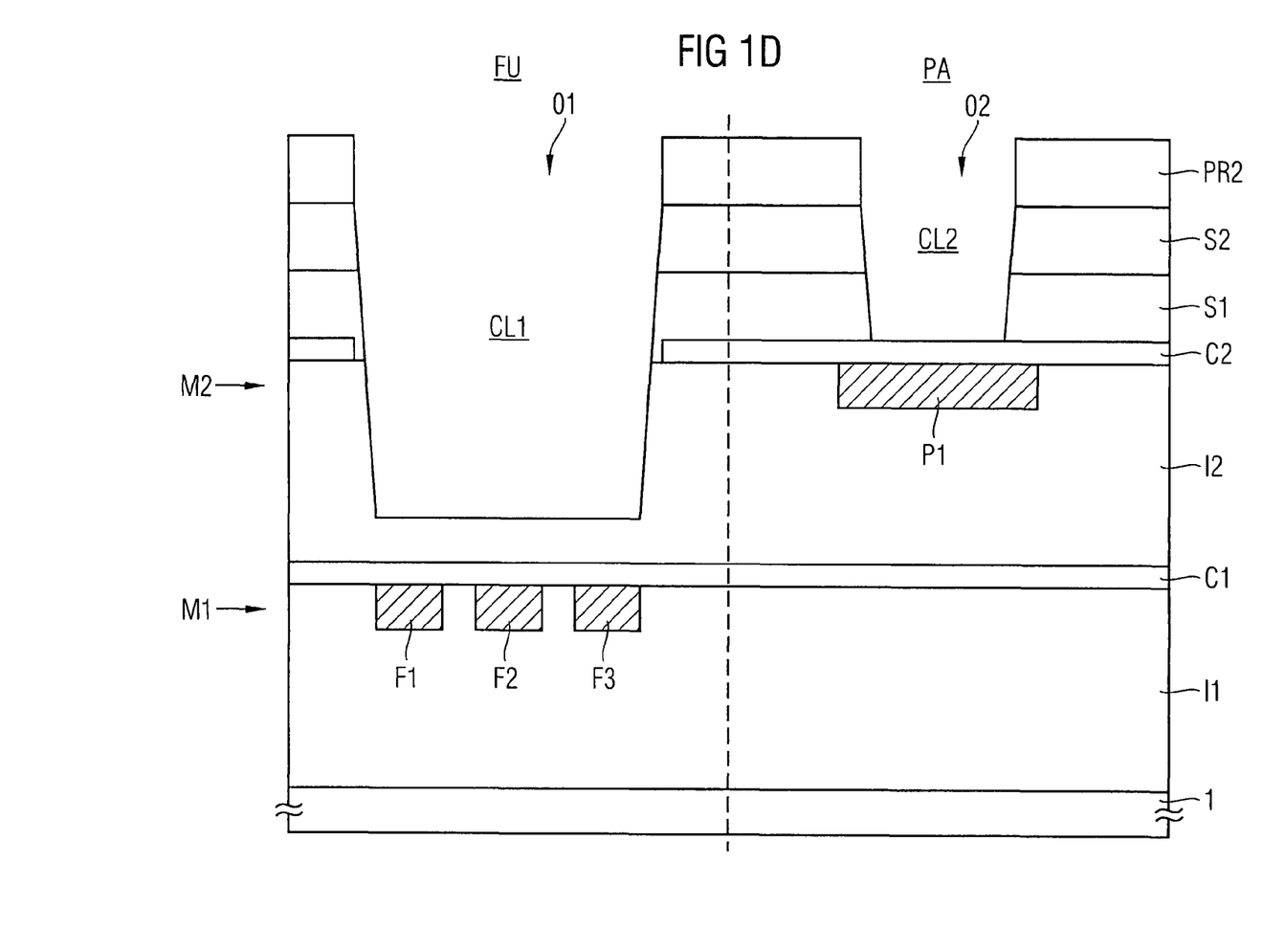

As depicted in FIG. 1D, a second photo-resist mask PR2 is formed on the second protective layer S2, such that it exhibits openings O1 and O2. Opening O1 defines a first contact hole CL1 to be etched in the fuse area, whereas opening O2 defines a second contact hole CL2 to be etched in the pad area.

In order to form these contact holes CL1, CL2 using the second photo-resist layer PR2 as a mask, a selective etching of nitride and oxide with respect to the material of the second cap layer C2 is performed.

Therefore, said etching step simultaneously etches the first contact hole CL1 in said fuse region FU and the second contact hole CL2 in said pad region PA. However, the etching in the pad region PA is stopped on said second cap layer C2 and the etching in said fuse region FU proceeds to a deeper level and is stopped at a certain remaining depth of said second insulating layer I2 made of silicon oxide. This can be achieved by controlling the etching time. The remaining depth of the second insulating layer I2 in said first contact hole CL1 is determined in accordance with the irradiation procedure to break the fuses F1, F2, F3.

Figure 1E:
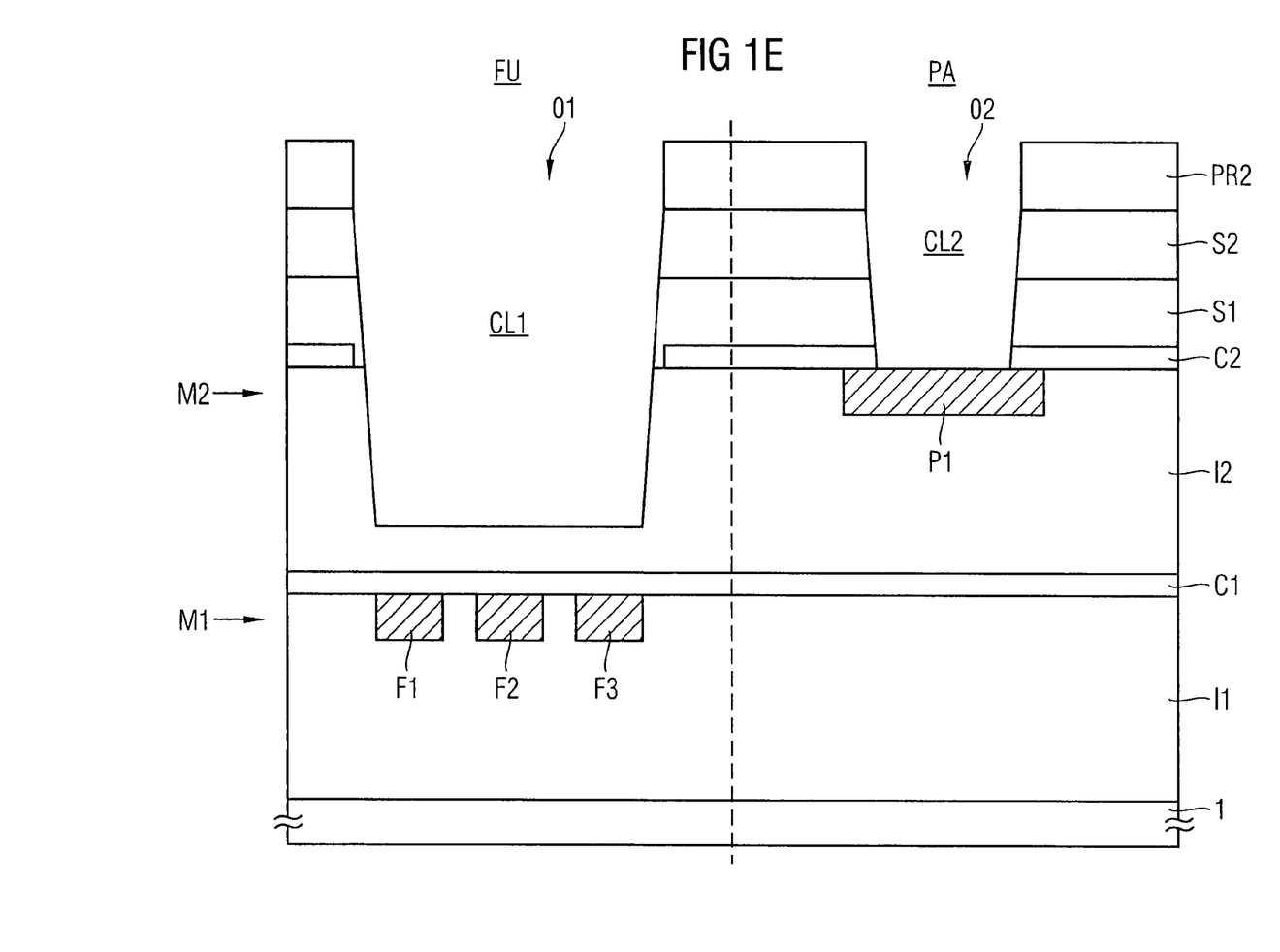

Finally, as depicted in FIG. 1E, a further etch step is performed in order to at least partially remove the second cap layer C2 from said second contact hole CL2 thus exposing the contact pad P1 in said pad region PA.

As becomes clear from the above description, the first embodiment involves an etch step to open the first contact hole CL1 in the fuse area FU which is seld aligned to the second cap layer C2. At the same time, protection of the contact pad P1 made of copper-containing material is assured by the cap layer C2.

Figure 1F:
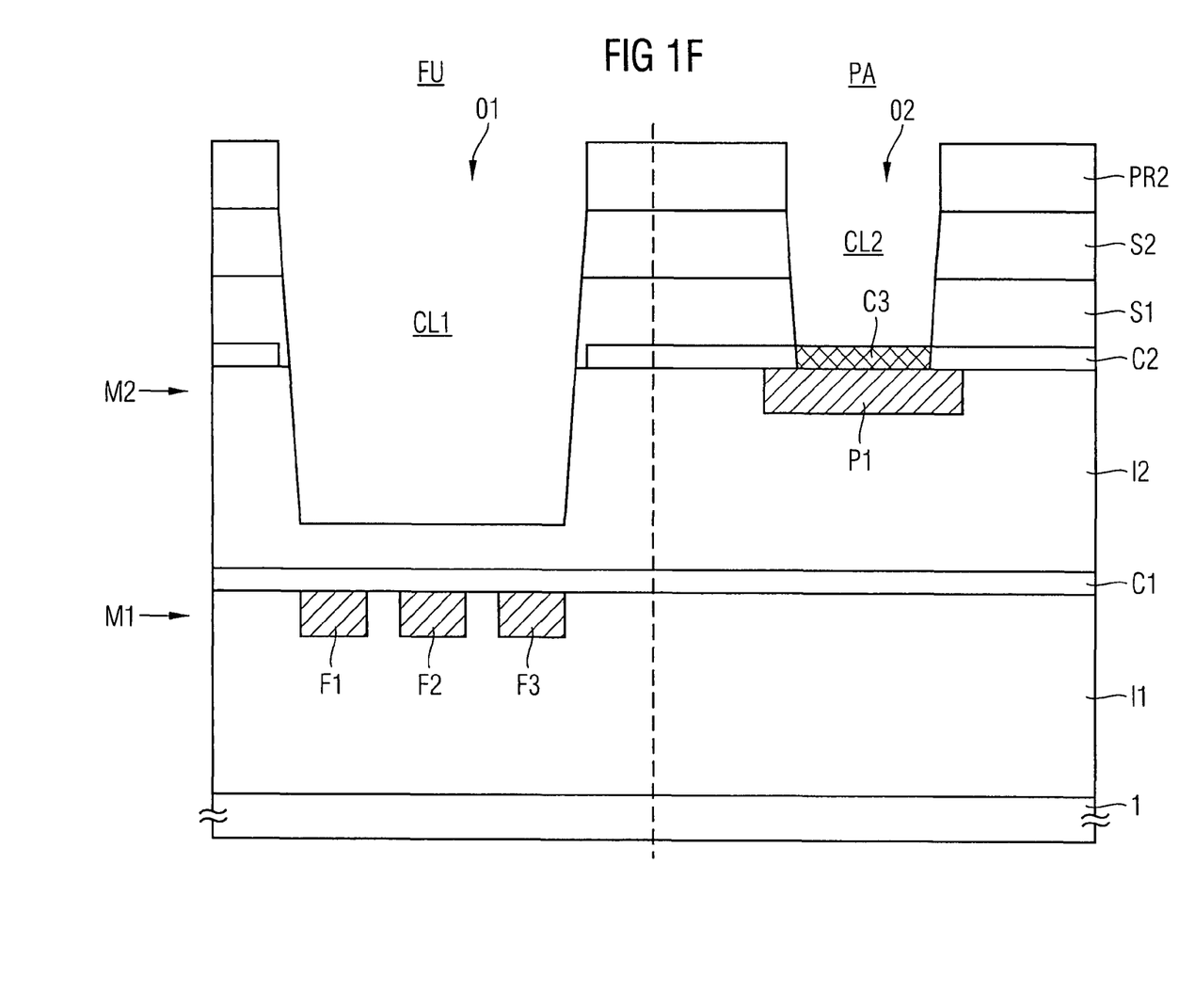

Optionally, as depicted in FIG. 1F, a third cap layer C3, e.g. made of CuWP or NiPdAu, can be selectively formed on the contact pad P1.

FIGS. 2A-D show schematic layouts for illustrating a manufacturing method for an integrated circuit device according to a second embodiment of the present invention.

Figure 2A:
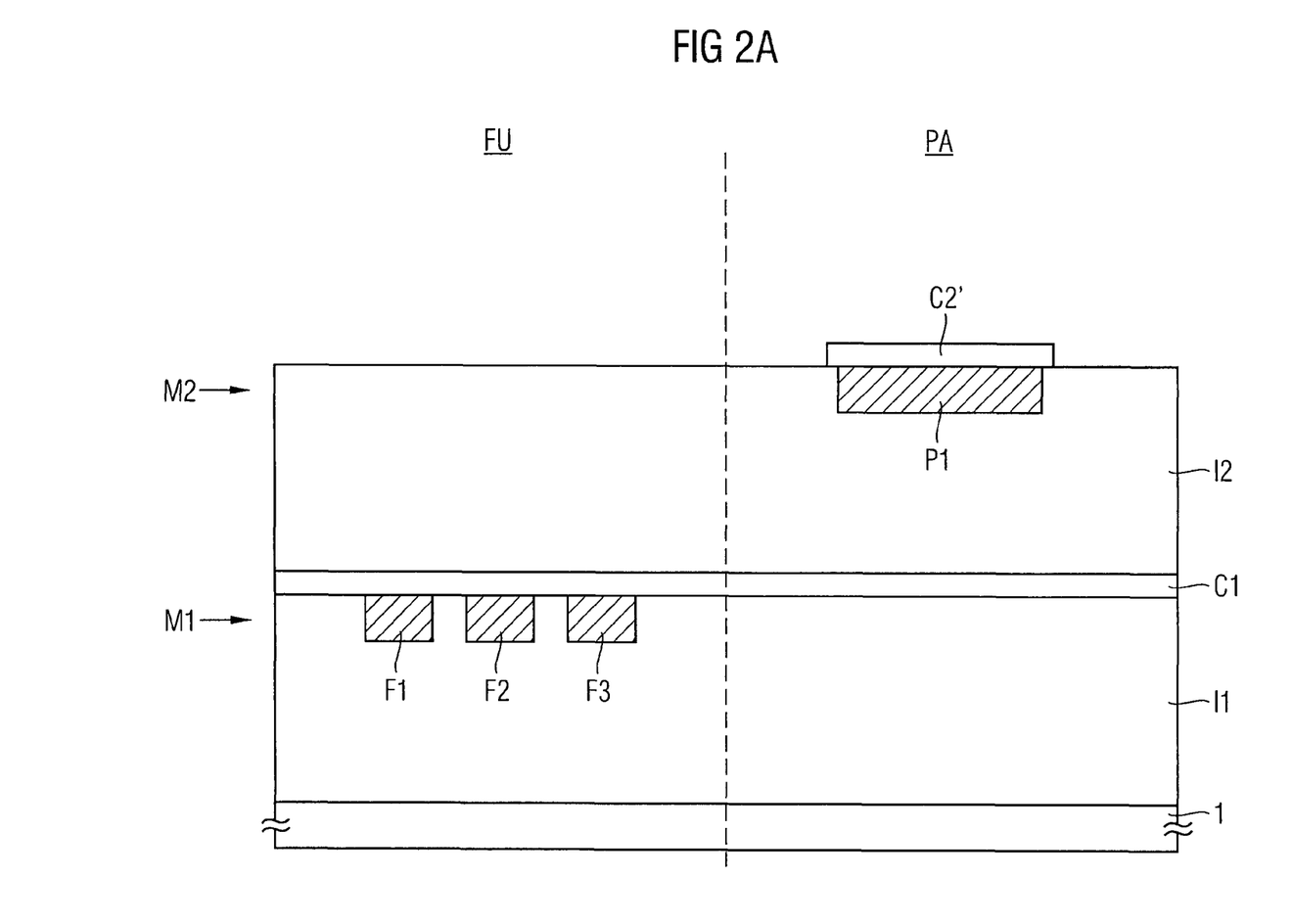
FIGS. 2A-D show schematic layouts for illustrating a manufacturing method for an integrated circuit device according to a second embodiment of the present invention.

Having regard to FIG. 2A, the second embodiment starts after the formation of the second metal level M2. Here, the second cap layer C2', e.g. made of CuWP or NiPdAu, is not deposited on the entire structure, but selectively formed exclusively on the contact pad P1 made of a copper-containing material or a copper comprising material, especially a copper rich material.

Figure 2B:
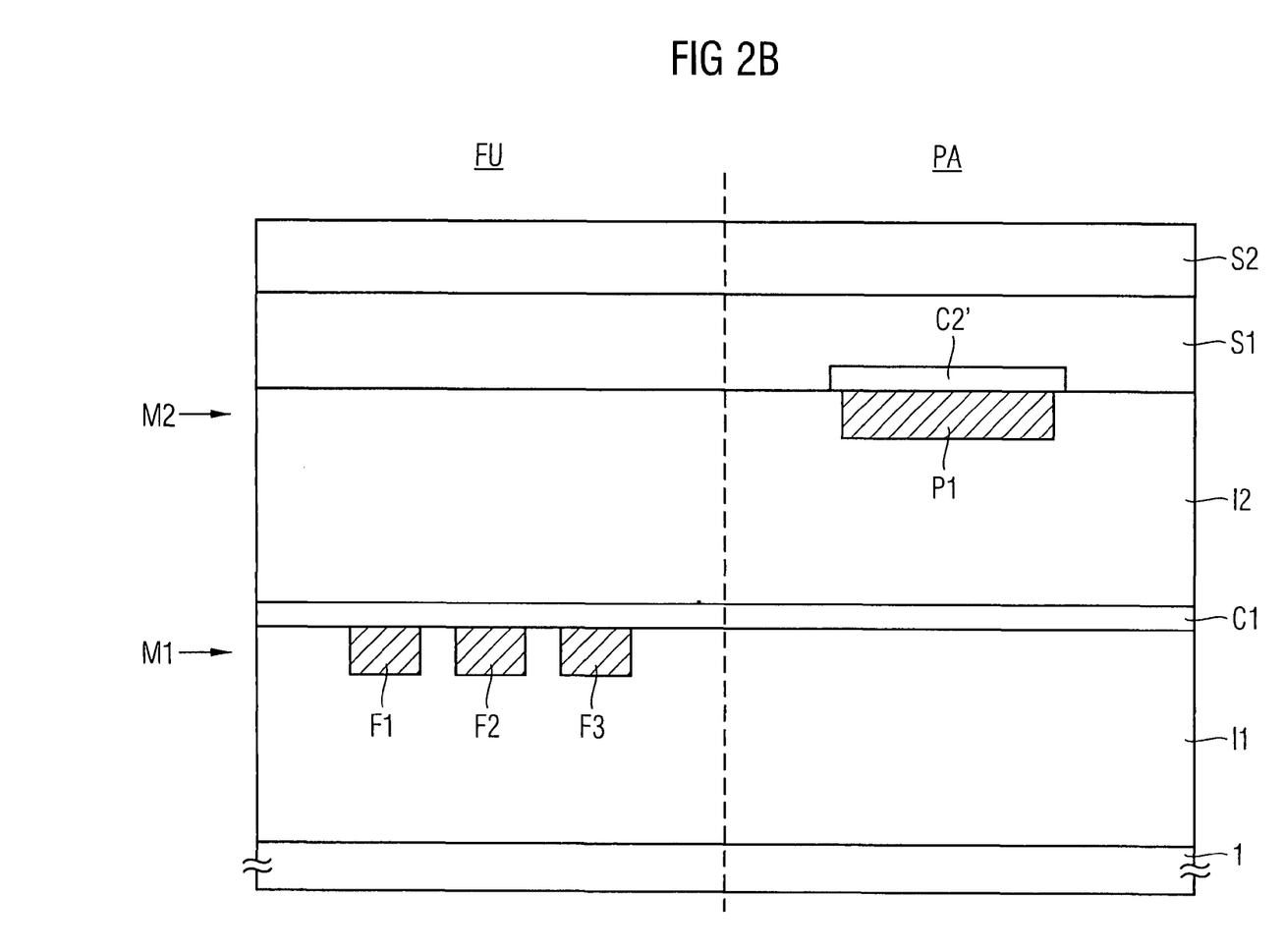

As shown in FIG. 2B, the first protective layer S1, which may comprise silicon oxide, and the second protective layer S2, which may comprise silicon nitride, are formed on the entire structure in the fuse area FU and pad area PA.

Figure 2C:
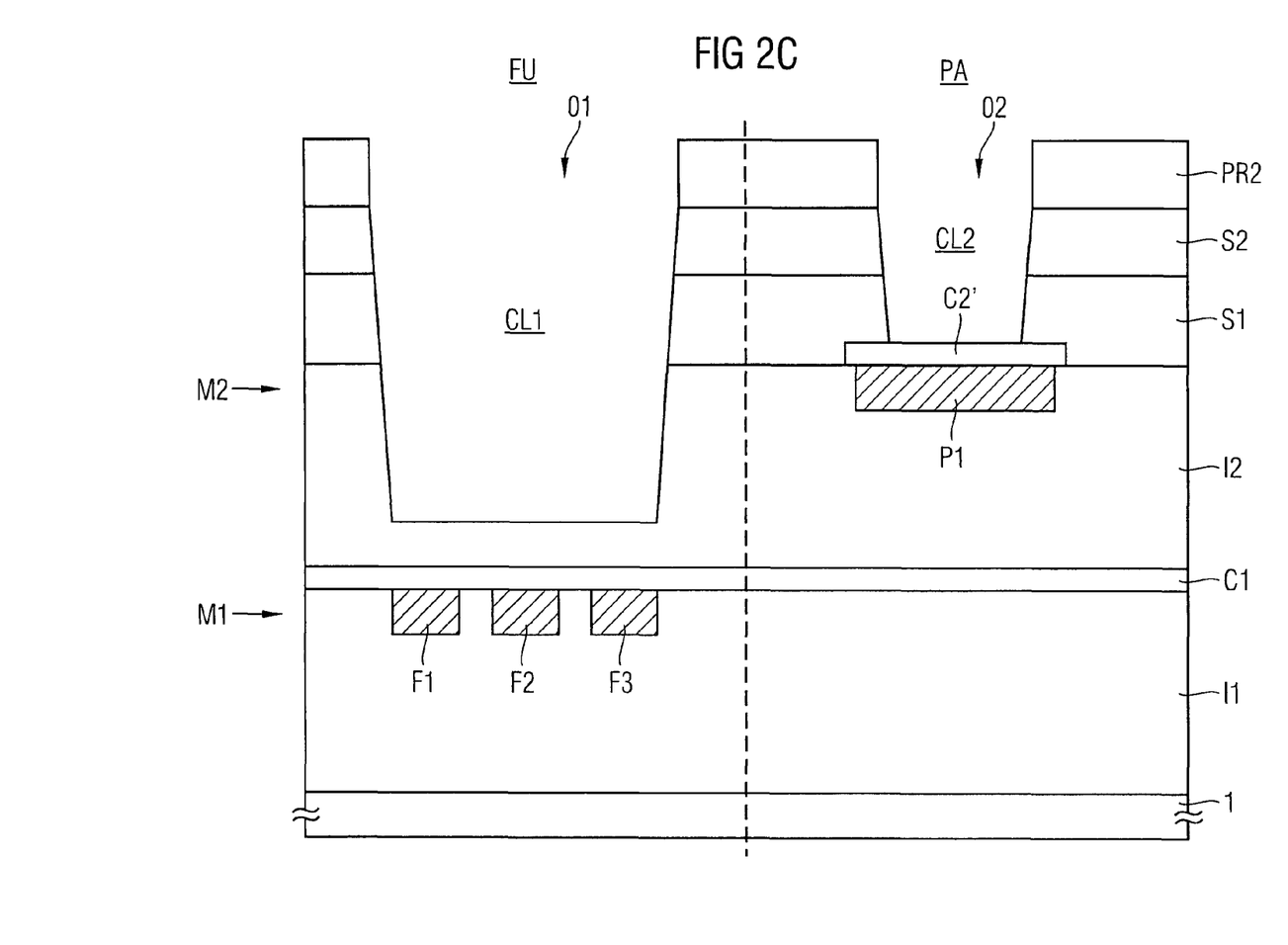

As depicted in FIG. 2C, the second photo-resist layer PR2 having the openings O1, O2 is then formed on the second protective layer S2. As mentioned above, opening O1 corresponds to the first contact hole CL1 in the fuse area FU and opening O2 corresponds to the second contact hole CL2 in the pad area PA.

The etching of the first and second contact holes CL1, Cl2 is simultaneously performed like in the first embodiment and particular stops on the second cap layer C2' arranged on the contact pad P1 in the pad region PA. In the fuse region FU, the etching proceeds to the above-mentioned desired remaining depth of the second insulating layer I2 above said fuses F1, F2, F3.

Figure 2D:
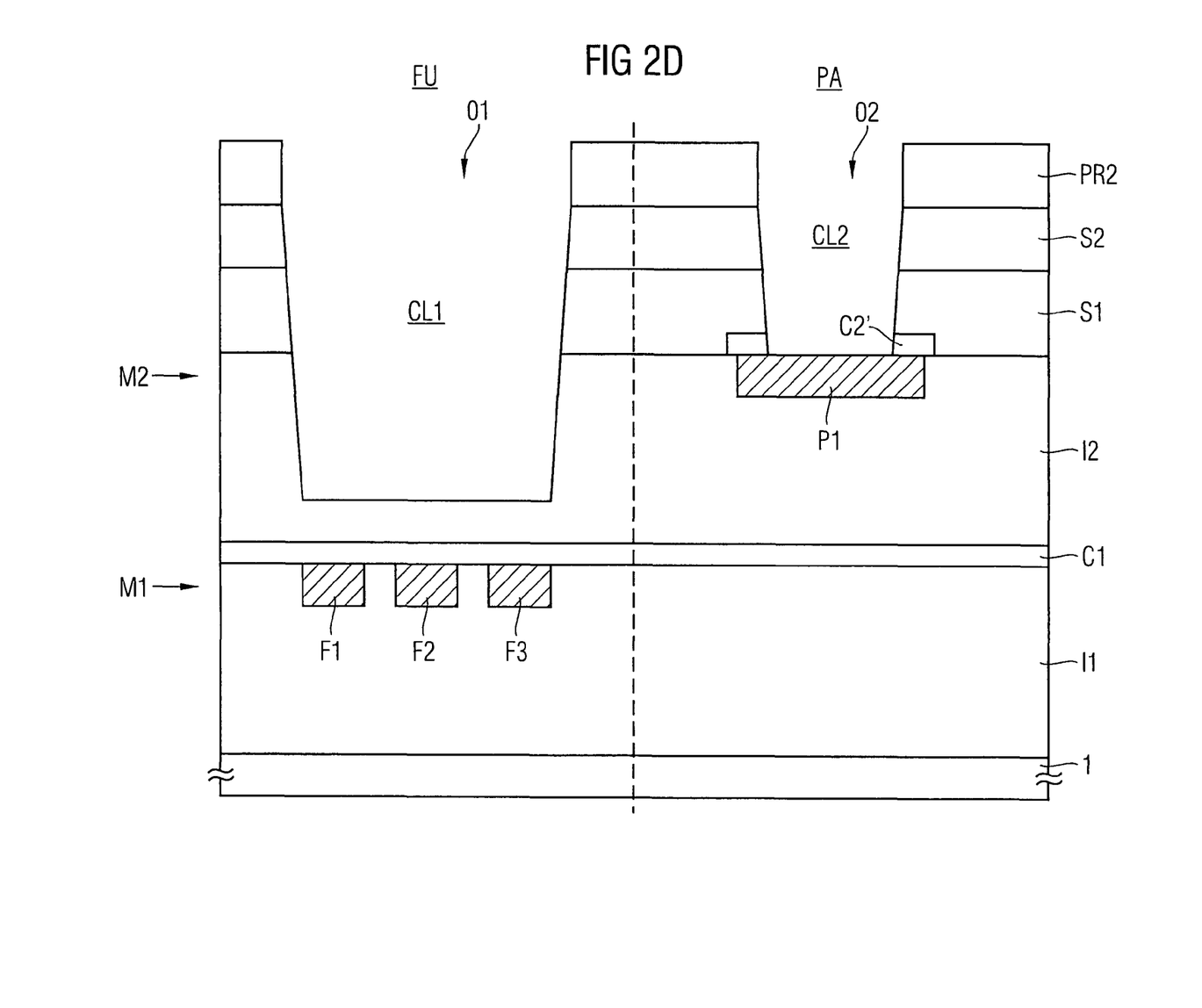

In contrast to the first embodiment, the second cap layer C2', is conductive. Therefore, the selectively formed second cap layer C2' may be used as protection layer during wafer testing. On the other hand, the second cap layer C2' may also be removed or partially removed from the second contact hole CL2, as depicted in FIG. 2D.

If the second cap layer C2' is left on the contact pad P1, it may still be intact after wafer probing and provide oxidation/corrosion protection of the contact pad P1 until packaging. Whether this is the case, depends on material properties and layer thickness of the cap layer and process parameters during wafer testing. In case that the second cap layer C2' is retained during wafer testing, an additional needle with self-cleaning effect is expected.

Since the material of the second cap layer C2' is conductive, capacitive coupling between neighbouring metal lines is reduced, because standard dielectric cap materials such as silicon nitride or silicon carbide have higher dielectric constants compared to said cap layer material.

Both the first and second embodiments allow simultaneous etching of the contact holes for the fuse windows and pads which results in process simplification.

Although the present invention has been described with reference to specific embodiments, it is not limited thereto, but can be modified in various manners which are obvious for a person skilled in the art. Thus, it is intended that the present invention is only limited by the scope of the claims attached herewith.

In particular, the present invention is not limited to the material combinations referred to in the above embodiments. Moreover, the invention is applicable for any kind of integrated circuit devices that use fuses and contact pads.

What is claimed is:

1. A manufacturing method for forming an integrated circuit device comprising the steps of:
    forming a first level on a substrate;
    forming a second level above the first level;
    forming a cap layer on the second level which covers a first region of the level and leaves a second region uncovered; and
    simultaneously etching a first contact hole in the first region and a second contact hole in the second region such that the etching is selective to the cap layer in the first region and proceeds to a deeper level in the second region, wherein the cap layer is selected from the group comprising silicon carbide and silicon nitride.

2. The manufacturing method of claim 1, wherein the first level is a metal level including a fuse region comprising a fuse and the second level is a metal level including a pad region comprising a contact pad.

3. The manufacturing method of claim 2, wherein the cap layer is deposited in the fuse region and the pad region, and thereafter at least partially removed from the fuse region.

4. The manufacturing method of claim 1, wherein the cap layer is selectively grown on the pad in the pad region.

5. The manufacturing method of claim 1, further comprising the step of selectively removing at least a part of the cap layer from the pad.

6. The manufacturing method of claim 2, wherein the second metal level is formed as a further Cu damascene layer comprising the pad made of a Cu containing material embedded in a second insulating layer.

7. The manufacturing method of claim 2, wherein at least one protective layer is formed on the second metal level after the cap layer has been formed and before the step of etching.

8. The manufacturing method of claim 1, wherein the cap layer selected from the group comprising CoWP and NiPdAu.

9. The manufacturing method of claim 1, wherein the first and second levels are metal levels including structured conductors and wherein the cap layer covers at least one conductor in the second region.

10. The manufacturing method of claim 9, wherein the cap layer is deposited in the first region and the second region, and thereafter at least partially removed from the first region.

11. The manufacturing method of claim 9, wherein the first level is formed as damascene layer comprising a fuse comprising a Cu comprising material embedded in a first insulating layer.

12. The manufacturing method of claim 9, wherein the second level is formed as a damascene layer comprising the pad comprising a Cu comprising material embedded in a second insulating layer.

* * * * *